United States Patent [19]

Cuomo et al.

[11] 4,351,712
[45] Sep. 28, 1982

[54] LOW ENERGY ION BEAM OXIDATION PROCESS

[75] Inventors: Jerome J. Cuomo, Lincolndale; James M. E. Harper, Yorktown Heights, both of N.Y.

[73] Assignee: International Business Machines Corporation, Armonk, N.Y.

[21] Appl. No.: 214,929

[22] Filed: Dec. 10, 1980

[51] Int. Cl.$^3$ .................. C23C 15/00; H01L 39/22
[52] U.S. Cl. .......................... 204/192 EC; 29/599; 357/5; 204/192 E; 427/38; 427/62
[58] Field of Search ............... 204/192 E, 192 EC; 427/38, 62; 357/5; 250/492 B; 29/599

[56] References Cited

U.S. PATENT DOCUMENTS

| 3,849,276 | 11/1974 | Greiner | 204/192 |
| 4,259,145 | 3/1981 | Harper et al. | 156/643 |
| 4,299,679 | 11/1981 | Suzuki | 204/192 EC |

OTHER PUBLICATIONS

G. Kaus et al., "Method of Producing Very Thin Oxide Layers on Substrates", *IBM Tech. Disc. Bull.*, vol. 21, p. 654, (1978).
J. M. E. Harper et al., "Dual-Ion-Beam Technique for Pinhole-Free Thin Films of Controlled Thickness", *IBM Tech. Disc. Bull.*, vol. 23, pp. 821–822, (1980).
A. W. Kleinsasser et al., "High-Quality Submicron Niobium Tunnel Junctions With Reactive-Ion-Beam Oxidation", *Appl. Phys. Lett.*, vol. 37, pp. 841–843, (1980).

*Primary Examiner*—Aaron Weisstuch
*Attorney, Agent, or Firm*—Philip Young; Hansel L. McGee; Jackson E. Stanland

[57] ABSTRACT

A surface reaction process for controlled oxide growth is disclosed using a directed, low energy ion beam for compound or oxide formation. The technique is evaluated by fabricating Ni-oxide-Ni and Cr-oxide-Ni tunneling junctions, using directed oxygen ion beams with energies ranging from about 30 to 180 eV. In one embodiment, high ion current densities are achieved at these low energies by replacing the conventional dual grid extraction system of the ion source with a single fine mesh grid. Junction resistance decreases with increasing ion energy, and oxidation time dependence shows a characteristic saturation, both consistent with a process of simultaneous oxidation and sputter etching, as in the conventional r.f. oxidation process. In contrast with r.f. oxidized junctions, however, ion beam oxidized junctions contain less contamination by backsputtering, and the quantitative nature of ion beam techniques allows greater control over the growth process.

12 Claims, 6 Drawing Figures

LOW ENERGY ION BEAM OXIDATION PROCESS

BACKGROUND OF THE INVENTION

The present invention relates to surface reaction processes for fabrication of semiconductor and Josephson devices, and more particularly to processes for providing controlled thickness growth of oxides or other reactive compounds.

DESCRIPTION OF THE PRIOR ART

Recent demands in the applications of metal-oxide-metal devices (MOM's) require very small areas and thin structures. In room temperature applications, MOM's have been employed as infrared detectors and mixers up to the near infrared. In cryogenic applications, MOM's are being used as Josephson junction switches in computer circuits and as detectors and mixers in the submillimeter range. These devices require a uniform oxide thickness in the range 5–25 Å, which is difficult to achieve reproducibly using thermal or plasma oxidation.

An r.f. oxidation process developed by J. H. Greiner is described in U.S. Pat. No. 3,849,276. The Greiner process combines simultaneous oxidation with sputter etching in an r.f. plasma to produce a steady-state oxide thickness. In the r.f. oxidation process disclosed by Greiner, low energy oxygen ions strike the metal with a broad range of energies since the ions are extracted from a plasma. Ions with kinetic energy less than the sputter threshold energy oxidize the metal, while ions with higher kinetic energy sputter etch the metal and oxide. If the initial oxidation rate is higher than the sputtering rate, a certain oxide thickness will be established after a characteristic time, determined by the rate of decrease in the oxidation rate with oxide thickness, and by the sputtering rate. Continuation of the process for a time, which is longer than needed for having oxidation rate and sputtering rate equal, will assure a pinhole free oxide with a reproducible final thickness.

Several known drawbacks limit the usefulness of the r.f. oxidation technique. (1) Processing parameters are interdependent. Changing the pressure, for example, changes both the ion acceleration voltage and current density. (2) Energetic electron bombardment heats up the sample and hastens oxidation. (3) The plasma is at an elevated potential relative to the chamber walls, resulting in a constant sputtering of the walls. (4) Sputtered atoms scatter from the gas back onto the sample, contaminating the oxide. At a pressure of 10 mTorr, typically used in r.f. oxidation, the mean free path for back-sputtered neutrals is only a few mm, and it has been found, for example, that the current density of superconducting tunnel junctions is greatly affected by the presence of backsputtered material.

Broad beam multiaperture ion sources, known in the art as "Kaufman sources", are widely used for etching applications, and energetic ion beams have been used to carry out reactive processes in a variety of configurations, such as disclosed by J. A. Taylor, G. M. Lancaster, A. Ignatiev, and J. W. Rabalais in the Journal of Chem. Physics, Vol. 68, No. 4, page 1776 (1978). Recently, A. W. Kleinsasser and R. A. Buhrman, in the 9th International Conference on Electron and Ion Beam Science and Technology, St. Louis, Mo. (1980), reported the fabrication of Josephson junctions by ion beam oxidation of Nb, using an Ar/$O_2$ ion beam with energy of 600 eV. In this latter work, however, oxidation occurred rapidly and was not the result of combined oxide growth and sputter etching.

It is an object of the present invention to fabricate Josephson junctions and semiconductor devices by a combined controlled oxide growth and sputter etching.

It is another object to provide a surface reaction process wherein a balance between oxide growth and sputter etching is achieved.

It is another object to provide an ion beam surface reaction technique for oxidation, deposition, or etching with substantially independent control over ion beam energy and current density.

SUMMARY OF THE INVENTION

These, and other objects, are achieved by the present invention which provides a surface reaction process for controlled oxide growth using ion beam oxidation techniques. The process of ion beam oxidation comprises using a large area, high current density oxygen ion beam with low energy, about 30 to 180 eV, which is directed at a substrate in a low gas pressure chamber for compound or oxide formation.

In one embodiment, ions are generated in a low voltage, thermionically supported plasma inside a discharge chamber at a pressure of about 1 mTorr. Ions are extracted into a beam of high ion current density by an extraction region consisting of a single, fine mesh grid. The beam is directed toward the sample situated in a low pressure region of about 0.1 mTorr, and a neutralizer means supplies electrons to compensate the positive charge of the ion beam.

Metal-oxide-metal junctions made by the technique according to the present invention show a junction resistance which decreases with increasing ion energy, and oxidation time dependence shows a characteristic saturation, both consistent with a process of simultaneous oxidation and sputter etching, as in the conventional r.f. oxidation process. In contrast with r.f. oxidized junctions, however, ion beam oxidized junctions contain less contamination by backsputtering, and the quantitative nature of ion beam techniques allows greater control over the growth process.

The general advantages of the ion beam techniques for oxidation, deposition or etching include: (1) Independent control over ion beam energy and current density; (2) Samples are isolated from the ion generation plasma; (3) Chamber walls are not subjected to energetic ion bombardment, since the beam is directed; (4) Since the mean free path of ions and sputtered atoms is greater than the chamber dimensions, back sputtering is minimized; and (5) Ions have a narrow energy spread (10–20 eV), enabling easier analysis.

DESCRIPTION OF THE PREFERRED EMBODIMENTS

Figure 1:
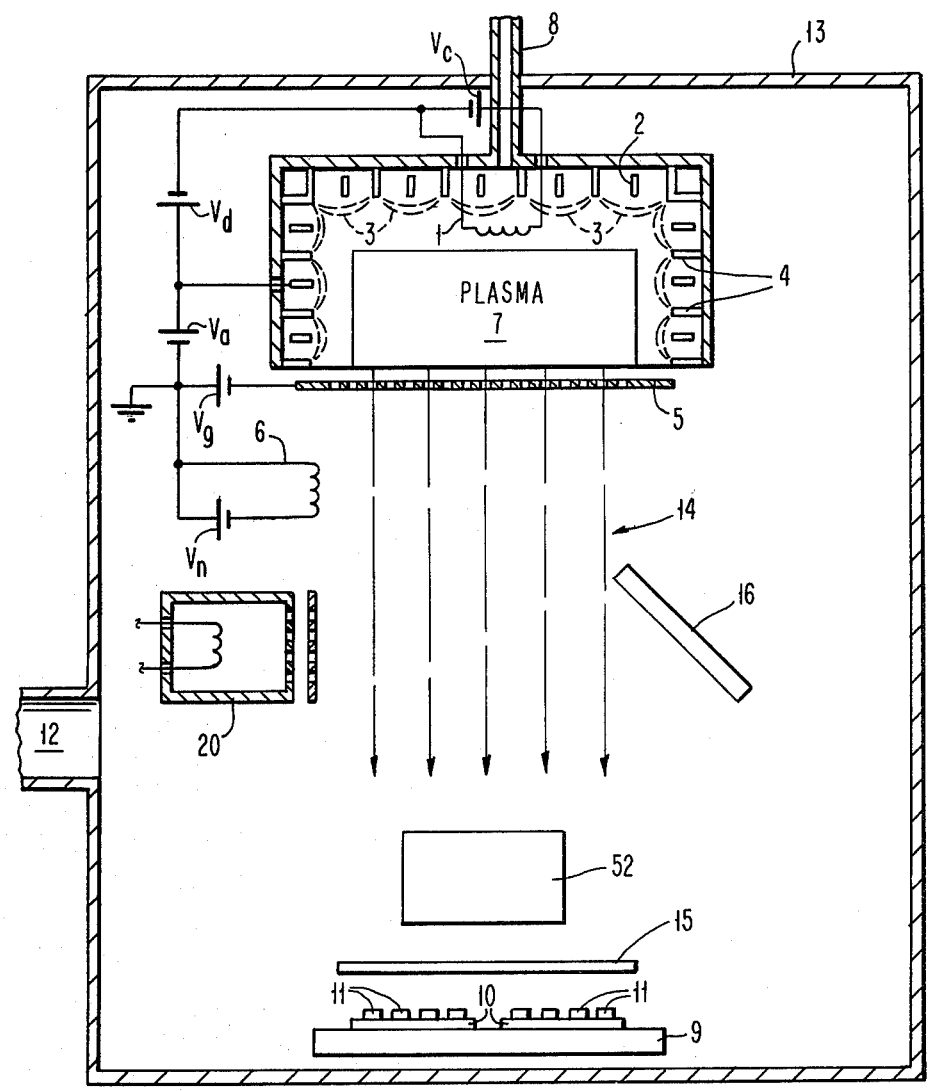
FIG. 1 is a schematic diagram of an ion beam oxidation system for carrying out the process according to the present invention.

FIG. 1 is a schematic diagram of an ion beam oxidation system in accordance with the present invention. Generally, the system includes a single grid ion source 10 for sputter cleaning and oxidation, a dual grid ion source 20 for overcoating of junctions, a movable ion energy analyzer 52, and a sample 10 on a water cooled holder 9. Specifically, the single grid ion source together with wafers 10 and holder 9 are contained within a vacuum chamber 13. Specifically, the ion source includes a thermionic cathode 1 located within the chamber 13 and a plurality of anodes 2 disposed around the ion source adjacent the walls and made of non-magnetic material such as stainless steel. The anodes 2 are located between pole pieces 4 on both sides of the anodes 2. The pole pieces 4 are made of a magnetically permeable material such as soft iron. A magnetic field is indicated by broken lines 3. Oxygen gas is provided into the ion source through a gas inlet 8. The gas is ionized by electrons from the cathode 1 which are accelerated to the anodes 2. Magnetic field lines 3 produced between the pole pieces 4 enhance the ionization efficiency. A multi-aperture accelerator grid 5 is shown at the lower end of the ion source. A plasma 7 is formed by the ions and electrons in the ion source chamber and provides a source of ions for the ion beam. These ions are extracted from the plasma 7 to the apertures in the accelerator grid 5 and form a beam shown by the ion trajectory lines 14 in FIG. 1.

Electrons are added to the beam 14 from a neutralizer 6 to prevent the charging up of insulating wafers 10. The wafers 10 to be oxidized are bombarded with the low energy ion beam 14. Such wafers 10 are mounted on holder 9 and have masking material 11 on them for delineating the desired patterns. Reactive species in the beam 14 combine with atoms in the wafer 10 to form solid compound products. Excess gas is removed by a pumping port 12 from the vacuum chamber 13.

The sample 10 to be oxidized is mounted with gallium backing on a water cooled copper block or wafer holder 9. Samples were prepared by sputter coating Si wafers with 1000 Å of either Ni or Cr followed by a layer of 1000 Å of $SiO_2$. The $SiO_2$ was chemically etched to define junction areas ranging from 5 $\mu m^2$ to 40 $\mu m^2$, in which the oxide was grown. A 7 cm diameter ion source equipped with a Ni mesh single grid 5 of 100 lines/inch faces the sample 10 at a distance of 15 cm. The ion source performs both precleaning and oxidation of the sample 10. A movable shutter 15 protects the sample 10, and the retarding grid energy analyzer 52 can be moved into the beam path to measure the ion beam energy distribution and current density. The separate ion source 20 directs a 2.0 cm diameter beam at a movable Ni target 16 to overcoat the oxidized sample with a Ni counterelectrode. A close-up view of the metal-oxide-junction formed by the system and process described above is provided in FIGS. 2 and 3, to be described below.

Typical electrical parameters of the single grid ion source are as follows: $V_c$ for heating the cathode 1 supplies typically 13 amps; $V_d$ (discharge voltage) needed to sustain the plasma, 40 volts for Ar and 70 volts for $O_2$; $V_a$ (anode voltage) approximately equal to the desired ion energy (30–180 eV); $V_g$ or grid voltage equal to minus 10 V; $V_n$ (neutralizer heater) typically supplying 6.5 amps. The gas pressure in the sample chamber is 0.3 mTorr. The dual grid ion source 20 was operated to produce an 800 eV, 12 mA $Ar^+$ ion beam for a deposition rate of nickel of about 2 Å/sec.

Figure 2:
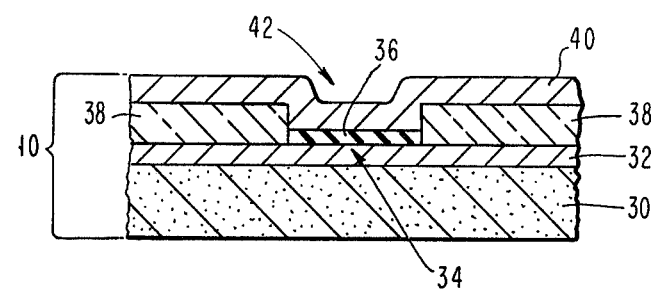
FIG. 2 shows a portion of a metal-oxide-metal junction formed on a substrate by the ion beam oxidation process of the present invention.
Figure 3:
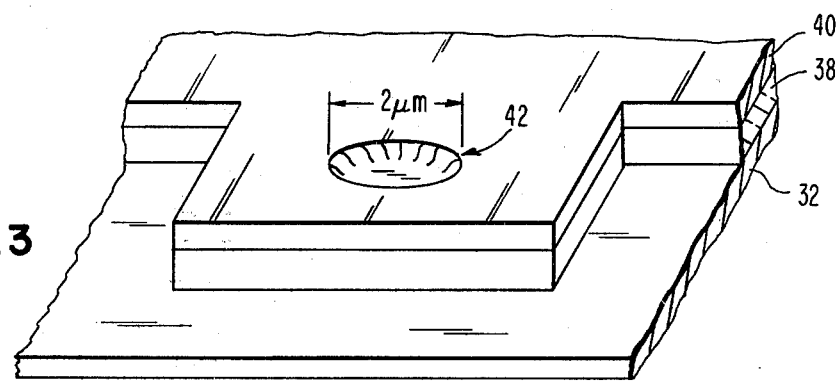
FIG. 3 shows a pictorial area view of a metal-oxide-metal junction with the top nickel electrode, the $SiO_2$ masking layer and the oxidation area being depicted.

After pumping the sample chamber to about $5 \times 10^{-7}$ Torr, the Ni target 16 is presputtered for 10 minutes with 800 eV $Ar^+$ ions. The sample 10 is then sputter etched for 5 minutes using $Ar^+$ ions at 150 eV and 0.72 $mA/cm^2$, to remove several hundred Å of Ni. Argon is next replaced with oxygen and the beam adjusted to desired conditions using the analyzer. The sample is then oxidized with the low energy oxygen ion beam of about 30 eV to 180 eV. The Ni target is resputtered with $Ar^+$ for 5 minutes, with the sample protected, to remove any oxide formed on the target during oxidation, followed by overcoating of the sample with 500–1000 Å of Ni. Multiple samples may be oxidized and overcoated independently in one pumping cycle of the system. Alternate thin film deposition source means, such as an evaporation source may be provided in place of ion source 20, for depositing additional thin film layers for electrical devices. Samples are then removed from the vacuum system. FIGS. 2 and 3 show cross-section and pictorial aerial views, respectively, of a portion of a metal-oxide-metal junction consisting of a silicon substrate 30, a nickel bottom electrode 32 and junction regions 34 delineated by $SiO_2$ masking layer 38. Ion beam oxidation is used to grow a thin oxide layer 36 in the junction region 34. A nickel top electrode 40 is deposited on the oxide layer 36 to complete the metal-oxide-metal junction. The junction area is located in the recess 42.

Figure 4:
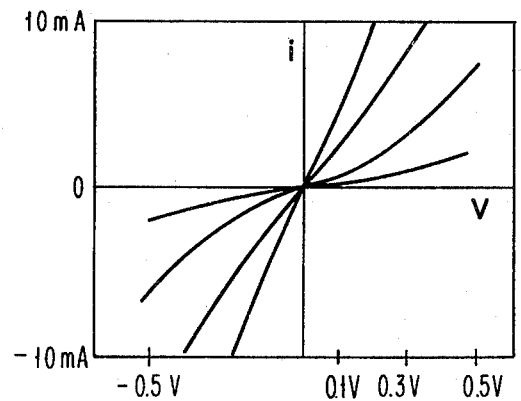
FIG. 4 is a graph of the current-voltage characteristics of nickel-oxide-nickel junctions fabricated by the ion beam oxidation process of the present invention.

Nickel and chromium metal films were oxidized by oxygen ion beams with energy ranging from 30 eV to 180 eV and current density of 0.72 $mA/cm^2$ for times ranging from 10 sec to 30 min. For each junction, the dynamic resistance was measured at zero bias as an indicator of oxide thickness. To indicate the range of values obtainable, current-voltage curves are shown in FIG. 4 for nickel-oxide-nickel junctions fabricated by ion beam oxidation. For low oxygen ion energy (30–40 eV), junction resistances of 10 kΩ or higher are obtained after several minutes oxidation (the curve of lowest slope in FIG. 4). By increasing oxygen ion energy, the junction resistance decreases to as low as 25Ω for energies above 100 eV, the curve of the highest slope in FIG. 4. Junctions are stable under biasing, with breakdown voltages of 1.5–2.5 V at room temperature. Here the wire resistance is 20 ohms. Increasing ion beam energies to above 150 eV results in shorted junctions.

Figure 5:
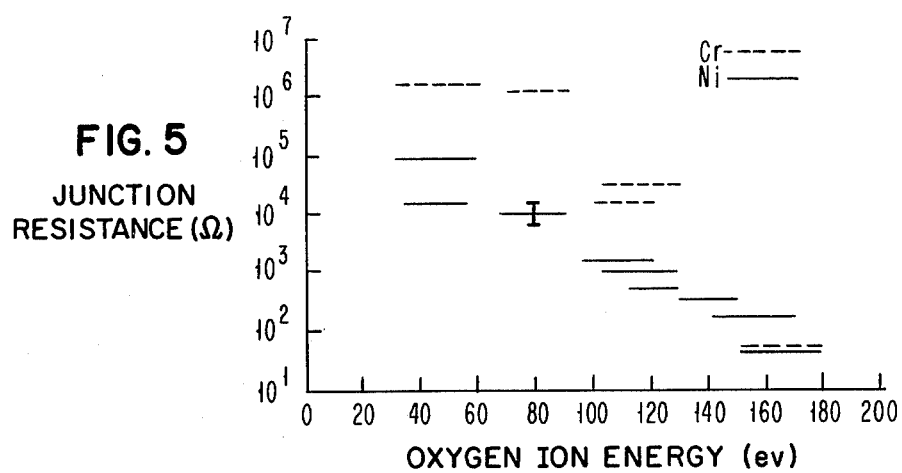
FIG. 5 is a graph showing the dependence of junction resistance on oxygen ion beam energy.

The dependence of junction resistance (10 $\mu m^2$ area) on oxygen ion beam energy is shown in FIG. 5 for both nickel and chromium junctions oxidized for 10 minutes at oxygen ion current density of 0.72 $mA/cm^2$. The junction resistance is a measure of oxide thickness. The spread of ion energy in the beam, typically 20 eV, is indicated by the width of each line shown for each point. As indicated in FIG. 4, junction resistance of nickel and chromium MOM's decreases with increasing oxygen ion beam energy, presumably due to increased sputter etching resulting in a thinner oxide layer. Chromium MOM's have somewhat higher resistances due to the greater reactivity of chromium.

Figure 6:
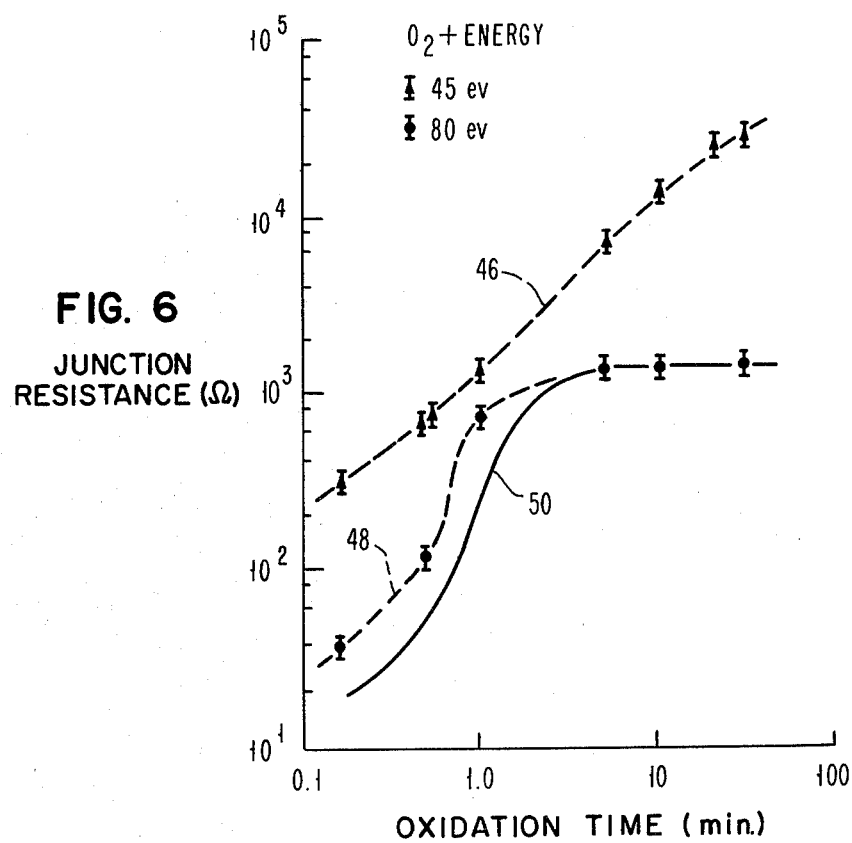
FIG. 6 is a graph showing the relationship between junction resistance and ion beam oxidation time.

Time dependence of junction resistance was also examined for ion beam oxidized Ni junctions as shown in FIG. 6. At an oxygen ion energy of 45 eV, the nickel junction resistance indicated by curve 46 increases monotonically with oxidation time, indicating an oxide growth component with negligible sputter etching. For an oxygen ion energy of 80 eV, however, the junction resistance indicated by curve 48 saturates after several minutes, indicating the formation of a steady state oxide thickness.

Some parameters governing the oxide growth can be deduced from FIG. 6. It is assumed that the junction tunneling resistance at low bias voltage is given by $R(x)=(A/x) \exp (B\phi^{\frac{1}{2}}x)$, where R is the dynamic resistance at zero bias, x is thickness, $\phi$ is the barrier height, and A and B are constants. For a barrier height of 1 eV, an oxide thickness of 10 Å leads to a resistance of 1.5 k$\Omega$. We now assume that the oxide growth rate is given by an exponentially decreasing function of thickness in combination with a constant sputter etching rate $dx/dt = K \exp(-x/X_o) - E$ where K is the initial oxidation rate in the absence of sputtering, $X_o$ is a constant determined by the rate of oxygen diffusion through the oxide, and E is the sputter etching rate. This analysis is described by Greiner in the aforementioned U.S. Pat. No. 3,849,276. In the presence of sputtering, the final oxide thickness is $X_o \ln (K/E)$, which is approached with a time constant $X_o/E$. From the data for an ion energy of 80 eV, shown in FIG. 6, we estimate a time constant of about 1 min. Assuming a sputtering rate of about 2 Å/min for nickel oxide under 80 eV $O_2^+$ bombardment at 0.72 mA/cm$^2$, we get $X_o = 2$ Å. We now express the junction resistance as a function of time: $\ln R = C + B\phi^{\frac{1}{2}}X_o \ln t$ where $C = \ln A - \ln x + B\phi^{\frac{1}{2}}X_o \ln (K/X_o)$. C can be regarded as a constant due to the weak dependence of ln x on t. The linear dependence of ln R on ln t is qualitatively seen in the 45 eV curve of FIG. 6.

From the final resistance of 1.5 k$\Omega$, one gets K$\cong$5 Å/sec. This value of initial oxidation rate is reasonable since the arrival rate of oxygen ions at 0.72 mA/cm$^2$ corresponds to approximately one monolayer of oxygen per second. If each ion were incorporated in the oxide, the growth rate would be several Å/sec. Substituting $X_o$, E, and K in x(t) for the general case of sputter-oxidation leads to $x(t) \cong 2 \ln 150[1 - \exp(-t)]$. Using the equation for R(x), the resistance is plotted as a solid curve 50 in FIG. 6 with a fairly good agreement with the measured resistances. The results indicate that a combined oxidation and sputtering process is responsible for the observed time dependence of junction resistances.

To further characterize the oxidation processes, Auger surface analysis spectroscopy was performed on ion beam oxidized Ni and Cr samples after air transfer. In all samples, 40-60% carbon contamination was detected, probably due to the air transfer and the exposure to diffusion pump vapor. It is known that in r.f. oxidized samples, large amounts of contaminant material, such as molybdenum, backsputtered from the sample holder, are observed in addition to the metal and oxygen in the oxide. By contrast, Mo was not detected in ion beam oxidized films, indicating the advantage of operating at low pressure.

Thus, there has been demonstrated a new process of metal oxidation which incorporates the advantages of low energy ion beams. The process is easily controlled and reproducible, and the resulting oxide junctions are of high quality and free of the contaminants usually found in the r.f. oxidation process.

It is to be understood that while a description of a low energy ion beam oxidation process has been provided together with the electrical characteristics of the oxide junctions formed thereby, the invention includes other types of compound formation, such as nitrides, hydrides and sulfides.

While the invention has been particularly shown and described with reference to the preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A surface reaction process for compound formation on the surface of a sample material situated in a sample chamber, comprising:
   forming an ion plasma with an ion source having magnetic field producing means located around a plasma discharge chamber of said ion source,
   feeding a gas into said ion plasma which will form a solid compound product when ions of said gas react with said surface of said sample material,
   extracting said ions of said gas out of said ion plasma to form an ion beam, and
   applying a voltage potential to said ion source which will accelerate ions of said gas to a low energy in a directed beam which impinges onto said surface of said sample material to produce simultaneous sputter etching and compound formation on said surface, said voltage potential being used to determine the resulting compound thickness, wherein the rate of compound formation balances the rate of sputter etching at said resulting thickness.

2. A process as recited in claim 1, wherein said voltage potential is in the range of about 30-180 electron volts to thereby provide a low energy directed ion beam in the same order of energy.

3. A process as recited in claim 1, wherein said ion source is an electron bombardment ion source having an anode and a cathode, and said voltage potential is applied to said ion source at said anode.

4. A process as recited in claim 3, wherein said voltage potential applied to said anode is in the range of about 30-180 electron volts.

5. A process as recited in claim 1, wherein said step of extracting said ions out of said ion plasma to form an ion beam is carried out by a single extraction grid having multiple apertures.

6. A process as recited in claim 5, wherein said single extraction grid is maintained at a potential of minus 10 volts with respect to ground.

7. A process as recited in claim 1, wherein said gas comprises oxygen for formation of oxide compounds.

8. A process as recited in claim 1, wherein the gas pressure in said sample chamber is 0.3 milliTorr or less.

9. A process as recited in claim 1, wherein the sample temperature is maintained at or near room temperature.

10. A method for forming a structure capable of supporting Josephson tunneling current therethrough comprising the steps of:
   forming a base electrode on a substrate,
   forming an insulating tunnel barrier on said base electrode by a surface reaction process for growing an insulating compound layer on the surface of said base electrode, said tunnel barrier being sufficiently thin to support Josephson tunneling current therethrough, said surface reaction process comprising the steps of, forming an ion plasma with an ion source, said plasma being located in a plasma discharge chamber of said ion source, feeding a gas into said ion plasma which will form said insulating solid compound layer when ions of said gas reacts with the surface of said base electrode, extracting said ions out of said plasma to form a directed ion beam, applying a voltage potential to said ion source to accelerate ions of said gas to a low energy in a directed beam which impinges upon the surface of said base electrode to produce simultaneous sputter etching and insulating compound formation on the surface of said base electrode, wherein the final thickness of said insulating tunnel barrier occurs when the rate of insulating compound formation balances the rate of sputter etching, said final thickness of said tunnel barrier being a function of said voltage potential, and forming a layer of material on said insulating tunnel barrier to form a counterelectrode.

11. The method of claim 10, wherein said gas is oxygen, and said insulating tunnel barrier is a native oxide grown on said base electrode.

12. The method of claim 11, wherein said voltage potential is in the range of about 30–180 electron volts.

* * * * *